(12) United States Patent
Kaneko et al.

(10) Patent No.: US 9,320,153 B2
(45) Date of Patent: Apr. 19, 2016

(54) PRINTED WIRING BOARD AND METHOD FOR MANUFACTURING THE SAME

(71) Applicant: IBIDEN CO., LTD., Ogaki-shi (JP)

(72) Inventors: Masahiro Kaneko, Ogaki (JP); Satoru Kose, Ogaki (JP); Hirokazu Higashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/548,725

(22) Filed: Nov. 20, 2014

(65) Prior Publication Data

US 2015/0075851 A1    Mar. 19, 2015

Related U.S. Application Data

(60) Continuation of application No. 13/776,024, filed on Feb. 25, 2013, now Pat. No. 8,935,850, which is a division of application No. 12/840,696, filed on Jul. 21, 2010, now Pat. No. 8,410,376.

(60) Provisional application No. 61/237,808, filed on Aug. 28, 2009.

(51) Int. Cl.
*H05K 3/02* (2006.01)
*H05K 3/10* (2006.01)
(Continued)

(52) U.S. Cl.
CPC .............. *H05K 3/42* (2013.01); *H01L 21/6835* (2013.01); *H01L 23/49816* (2013.01); *H01L 23/49827* (2013.01); *H01L 24/48* (2013.01); *H01L 25/0657* (2013.01); *H05K 1/0313* (2013.01);
(Continued)

(58) Field of Classification Search
CPC ..................... H01L 2224/73265; H05K 1/113; H05K 2203/072; H05K 2203/1377; Y10T 29/49155; Y10T 29/49165; Y10T 29/49227
USPC ............ 29/846, 834, 847, 852; 174/252, 255, 174/257, 258, 260, 262, 266; 438/108, 123, 438/401, 424, 464, 599
See application file for complete search history.

(56) References Cited

U.S. PATENT DOCUMENTS 6,410,937 B1    6/2002    Taran et al.
6,709,962 B2    3/2004    Berg
(Continued)

FOREIGN PATENT DOCUMENTS

CN    101965097 A    2/2011
JP    2006-019433    1/2006

*Primary Examiner* — Thiem Phan
(74) *Attorney, Agent, or Firm* — Oblon, McClelland, Maier & Neustadt, L.L.P

(57) ABSTRACT

A printed wiring board includes an interlayer resin insulation layer having a penetrating hole, a conductive circuit formed on a first surface of the interlayer resin insulation layer, a filled via conductor formed in the penetrating hole of the interlayer resin insulation layer and connected to the conductive circuit, a first surface-treatment coating structure formed on a first surface of the filled via conductor and having an electroless plating structure, and a second surface-treatment coating structure formed on a second surface of the filled via conductor on an opposite side with respect to the first surface-treatment coating structure and having an electroless plating structure. The filled via conductor includes a first conductive layer formed on side wall of the penetrating hole and a plated material filling the penetrating hole, and the first surface-treatment coating structure has a thickness which is different from a thickness of the second surface-treatment coating structure.

20 Claims, 15 Drawing Sheets

(51) Int. Cl.
　　*H05K 3/42*　　　　(2006.01)
　　*H01L 21/683*　　(2006.01)
　　*H01L 23/498*　　(2006.01)
　　*H01L 23/00*　　　(2006.01)
　　*H01L 25/065*　　(2006.01)
　　*H05K 1/11*　　　(2006.01)
　　*H05K 1/03*　　　(2006.01)
　　*H05K 3/22*　　　(2006.01)
　　*H05K 3/00*　　　(2006.01)
　　*H05K 3/38*　　　(2006.01)

(52) U.S. Cl.
　　CPC ............... *H05K 1/113* (2013.01); *H05K 1/115* (2013.01); *H05K 3/22* (2013.01); *H01L 23/49866* (2013.01); *H01L 24/45* (2013.01); *H01L 2221/68345* (2013.01); *H01L 2224/32057* (2013.01); *H01L 2224/32145* (2013.01); *H01L 2224/32225* (2013.01); *H01L 2224/45144* (2013.01); *H01L 2224/484* (2013.01); *H01L 2224/48091* (2013.01); *H01L 2224/48145* (2013.01); *H01L 2224/48227* (2013.01); *H01L 2224/48235* (2013.01); *H01L 2224/48599* (2013.01); *H01L 2224/48644* (2013.01); *H01L 2224/73265* (2013.01); *H01L 2224/83385* (2013.01); *H01L 2224/85001* (2013.01); *H01L 2224/85385* (2013.01); *H01L 2224/85444* (2013.01); *H01L 2225/0651* (2013.01); *H01L 2225/06506* (2013.01); *H01L 2225/06562* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01014* (2013.01); *H01L 2924/01019* (2013.01); *H01L 2924/01028* (2013.01); *H01L 2924/01029* (2013.01); *H01L 2924/01033* (2013.01); *H01L 2924/01046* (2013.01); *H01L 2924/01078* (2013.01); *H01L 2924/01079* (2013.01); *H01L 2924/01082* (2013.01); *H01L 2924/04941* (2013.01); *H01L 2924/12041* (2013.01); *H01L 2924/12042* (2013.01); *H01L 2924/15311* (2013.01); *H01L 2924/181* (2013.01); *H01L 2924/3025* (2013.01); *H05K 3/007* (2013.01); *H05K 3/108* (2013.01); *H05K 3/388* (2013.01); *H05K 2201/0344* (2013.01); *H05K 2201/09509* (2013.01); *H05K 2201/09527* (2013.01); *H05K 2201/09563* (2013.01); *H05K 2203/072* (2013.01); *H05K 2203/1377* (2013.01); *Y10T 29/49155* (2015.01); *Y10T 29/49156* (2015.01); *Y10T 29/49165* (2015.01)

(56) References Cited

U.S. PATENT DOCUMENTS

| | | | |
|---|---|---|---|
| 7,838,779 B2* | 11/2010 | Yamamichi | H01L 21/486 174/260 |
| 7,884,484 B2* | 2/2011 | Yamano | H01L 23/18 174/255 |
| 7,935,893 B2 | 5/2011 | Tanaka et al. | |
| 7,985,663 B2 | 7/2011 | Sato et al. | |
| 2005/0251997 A1 | 11/2005 | Homg et al. | |
| 2006/0202344 A1 | 9/2006 | Takada et al. | |
| 2009/0298228 A1 | 12/2009 | Sato et al. | |
| 2011/0067913 A1 | 3/2011 | Kaneko et al. | |
| 2012/0080786 A1 | 4/2012 | Furutani et al. | |

* cited by examiner

PRINTED WIRING BOARD AND METHOD FOR MANUFACTURING THE SAME

CROSS-REFERENCE TO RELATED APPLICATIONS

The present application is a continuation of and claims the benefit of priority to U.S. application Ser. No. 13/776,024, filed Feb. 25, 2013, which is a divisional of and claims the benefit of priority to U.S. application Ser. No. 12/840,696, filed Jul. 21, 2010, now U.S. Pat. No. 8,410,376, issued Apr. 2, 2013, which is based on and claims the benefit of priority to U.S. Application No. 61/237,808, filed Aug. 28, 2009. The entire contents of these applications are incorporated herein by reference.

BACKGROUND OF THE INVENTION

1. Field of the Invention

The present invention relates to a super-thin printed wiring board which can be preferably used in an SSD or the like to mount multiple flash memories, and to a method for manufacturing such a printed wiring board.

2. Discussion of the Background

Japanese Laid-Open Patent Publication 2006-19433 describes a manufacturing method which aims to provide a thin-type wiring board, for example. In the manufacturing method, an insulation layer is formed on a silicon substrate, and a via conductor is formed in the insulation layer. After that, a wiring layer is formed on the via conductor, and a semiconductor element is mounted on the wiring layer and encapsulated with resin. Then, a wiring board is obtained by removing the silicon substrate. The contents of this publication are incorporated herein by reference in their entirety.

SUMMARY OF THE INVENTION

According to one aspect of the present invention, a printed wiring board includes an interlayer resin insulation layer having a penetrating hole for a via conductor, a conductive circuit formed on one surface of the interlayer resin insulation layer, a via conductor formed in the penetrating hole and having a protruding portion protruding from the other surface of the interlayer resin insulation layer, and a surface-treatment coating formed on the surface of the protruding portion of the via conductor. The via conductor is connected to the conductive circuit and has a first conductive layer formed on the side wall of the penetrating hole and a plated layer filling the penetrating hole.

According to another aspect of the present invention, a method for manufacturing a printed wiring board includes forming a removable layer on a support substrate, forming an interlayer resin insulation layer on the removable layer, forming a penetrating hole in the interlayer resin insulation layer, forming a first conductive layer on the interlayer resin insulation layer and on a side wall of the penetrating hole, forming a conductive circuit on the interlayer resin insulation layer, forming a via conductor in the penetrating hole, removing the support substrate from the interlayer resin insulation layer by using the removable layer, forming a protruding portion of the via conductor protruding from a surface of the interlayer resin insulation layer, and forming a surface-treatment coating on a surface of the protruding portion of the via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
FIGS. 1(A)-1(C) are views of the steps for manufacturing a printed wiring board according to the first embodiment of the present invention.

The embodiments will now be described with reference to the accompanying drawings, wherein like reference numerals designate corresponding or identical elements throughout the various drawings.

First Embodiment

A printed wiring board according to the first embodiment of the present invention and a method for manufacturing such a printed wiring board are described with reference to FIGS. 1-9.

Figure 7:
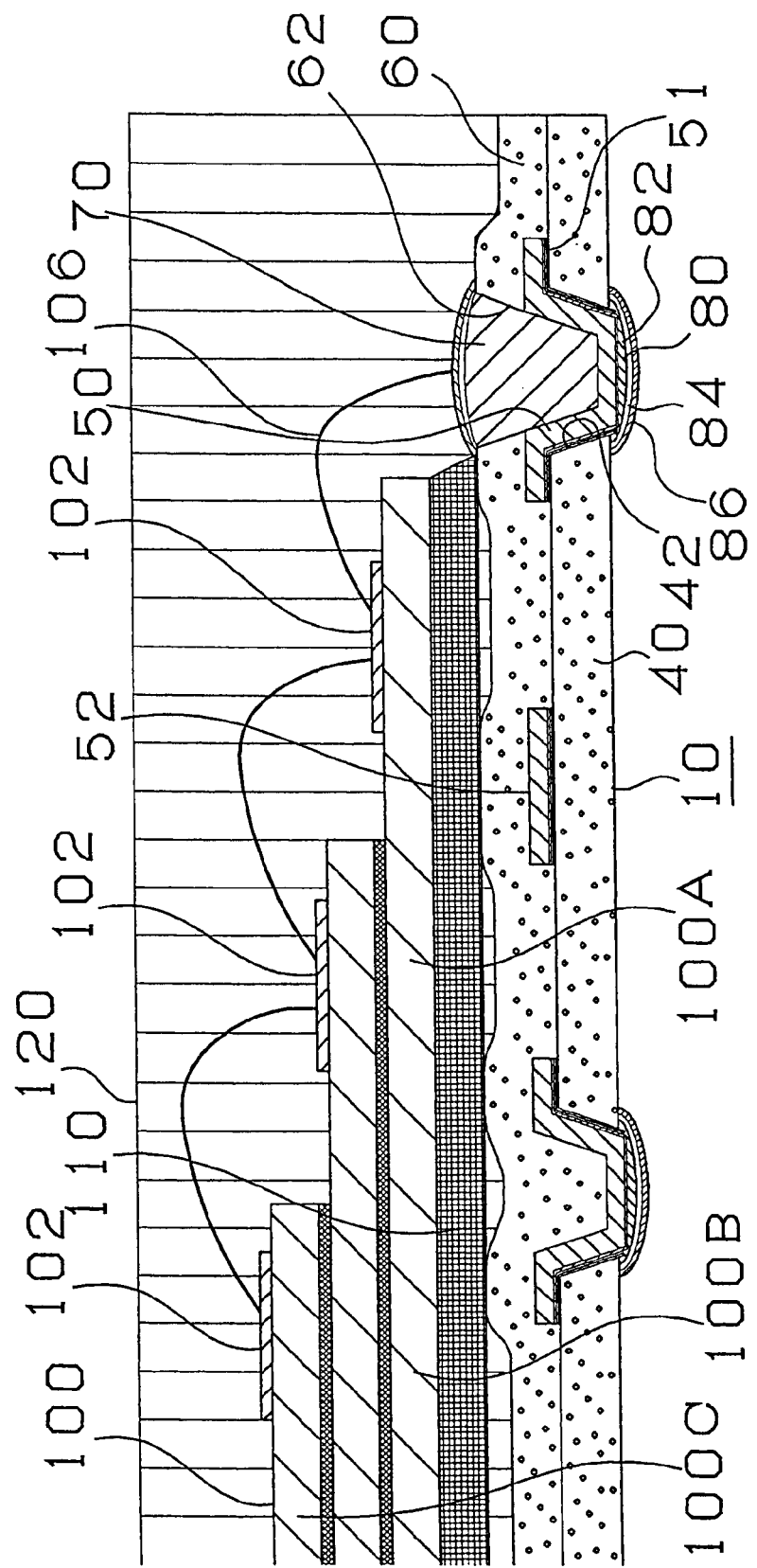
FIG. 7 is a cross-sectional view showing a printed wiring board of the first embodiment.

FIG. 7 is a cross-sectional view showing part of printed wiring board 10. In printed wiring board 10, memory laminate 100 made by laminating multiple sheets of memories (100A, 100B, 100C) is mounted. Memory laminate 100 is fixed to printed wiring board 10 by means of adhesive layer 110. The memories of memory laminate 100 are connected to each other by wires 106, for example. The memories may also be connected to each other by wiring formed by inkjet.

Printed wiring board 10 has a double-layer structure of first interlayer resin insulation layer 40 and second interlayer resin insulation layer 60. In opening 42 formed in first interlayer resin insulation layer 40, via conductor 50 is formed. On first interlayer resin insulation layer, conductive circuit 52 and via land 51 are formed. Opening 62 is formed in second interlayer resin insulation layer 60, and surface-treatment coating 70 is formed in opening 62. Printed wiring board 10 and memory laminate 100 are connected by wire 106 spanning between surface-treatment coating 70 of printed wiring board 10 and pad 102 of memory laminate 100. On the lower-surface side (first-surface side) of via conductor 50, surface-treatment coating 80 for external connection is formed to have a structure that enables wire bonding. Memory laminate 100 is encapsulated with molding resin 120.

Figure 9A:
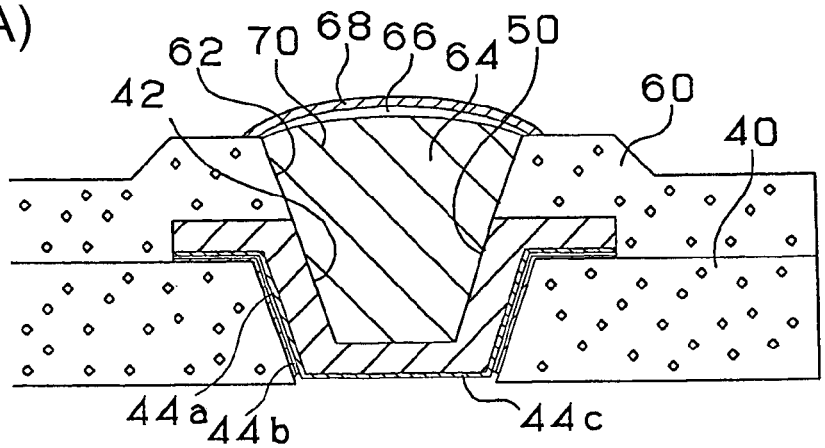
FIGS. 9(A)-9(C) are views of the manufacturing steps shown by magnifying a via conductor and a bump in a printed wiring board of the first embodiment.
Figure 9B:
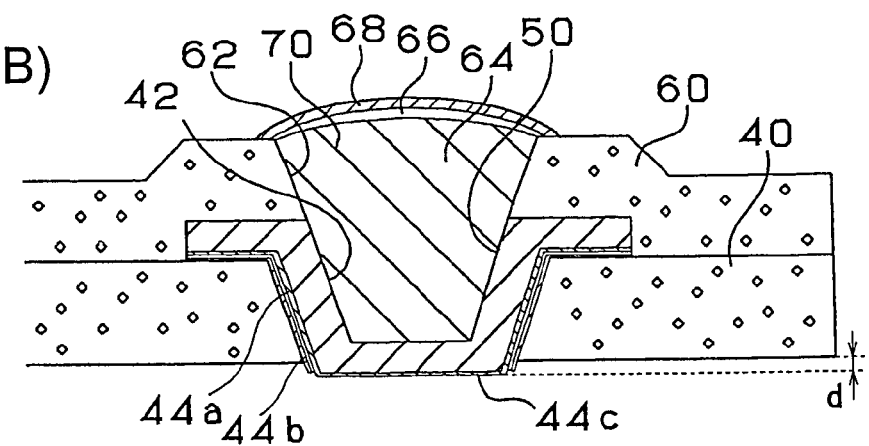
Figure 9C:
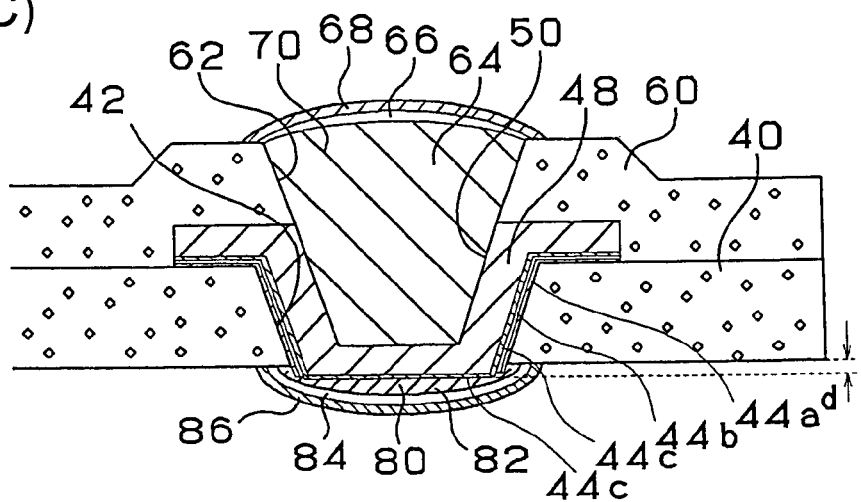

FIG. 9C shows a magnified view of the area surrounding via conductor 50 in FIG. 7. Surface-treatment coating 70 on via conductor 50 is formed with Ni-plated material 64 which is filled in opening 62 in second interlayer resin insulation layer 60, Pd film 66 on Ni-plated material 64 and Au film 68 on Pd film 66. Au film 68 is coated for the purposes of preventing corrosion of the conductive circuit and of allowing wire 106 made of a gold wire to make easy bonding.

On the side wall of opening 42 in first interlayer resin insulation layer 40, TiN-sputtered film (44a) (first conductive layer), Ti-sputtered film (44b) (first conductive layer) and Cu-sputtered film (44c) (second conductive layer) are formed in that order. Namely, via conductor 50 is formed with TiN-sputtered film (44a), Ti-sputtered film (44b), Cu-sputtered film (44c) and electrolytic copper-plated film 48 formed on the inner side of Cu-sputtered film (44c). TiN-sputtered film (44a) and Ti-sputtered film (44b) are removed from the bottom-surface side (first-surface side) of via conductor 50, and surface-treatment coating 80 is formed on the surface of Cu-sputtered film (44c). Surface-treatment coating 80 is formed with Ni film 82 formed on the first surface of via conductor 50, Pd film 84 on Ni film 82 and Au film 86 on Pd film 84.

Figure 10A:
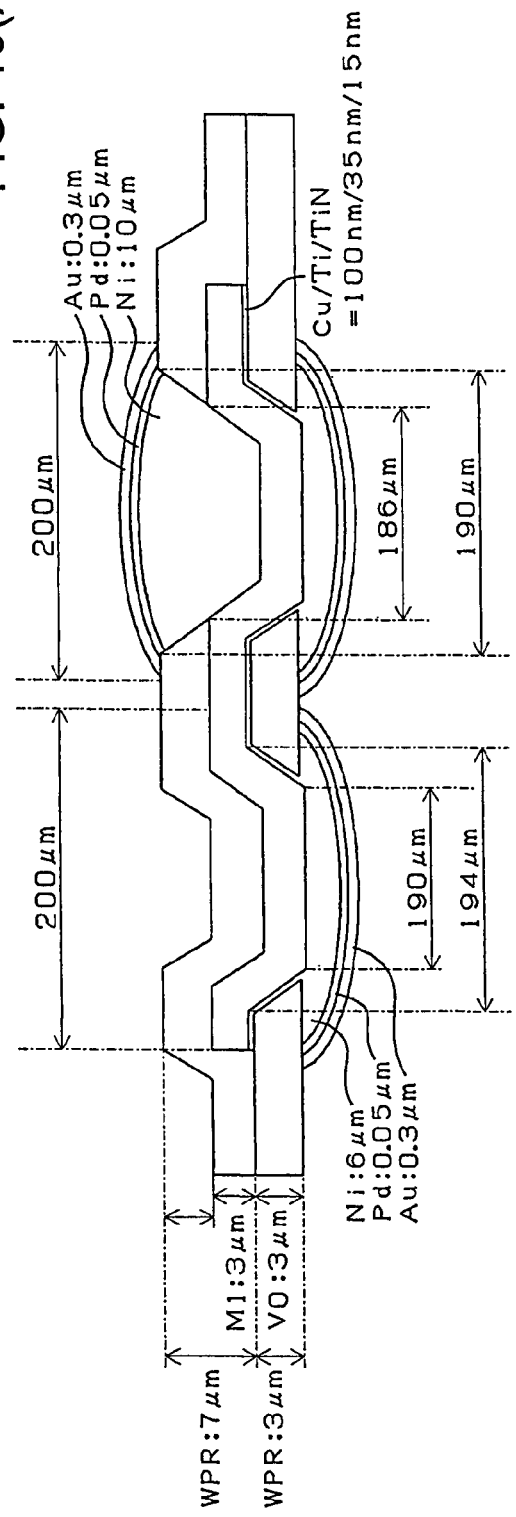
FIGS. 10(A)-10(B) are views illustrating a via conductor in a printed wiring board of the first embodiment.

The film thickness of each layer is shown in FIG. 10A. The first interlayer resin insulation layer and the second interlayer resin insulation layer are formed to be approximately 3 μm thick. The Ni-plated layer forming surface-treatment coating 70 is formed to be approximately 10 μm thick. The Pd film on the Ni-plated layer is formed to be approximately 0.05 μm, and the Au film on the Pd film approximately 0.3 μm. Meanwhile, the Cu-sputtered film formed on the side wall of a via-conductor opening is formed to be approximately 100 nm, the Ti-sputtered film approximately 35 nm, and the TiN-sputtered film approximately 15 nm. The Ni-sputtered layer forming surface-treatment film 80 is formed to be approximately 6 μm, the Pb layer approximately 0.05 μm and the Au layer approximately 0.3 μm.

Figure 10B:
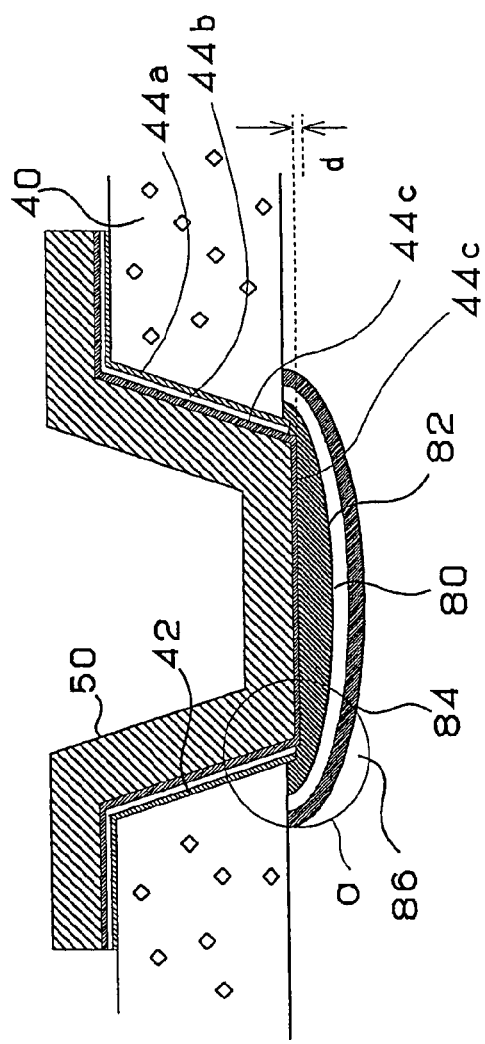

As described above, Ti-sputtered film (44b) and TiN-sputtered film (44a) are removed from the bottom-surface side of via conductor 50, and the surface of Cu-sputtered film (44c) protrudes by distance (d) (50 μm) from the second surface of first interlayer resin insulation layer 40 (see FIG. 10B).

In a printed wiring board according to the first embodiment, since the bottom surface of via conductor 50 protrudes by (d) (50 μm) from the bottom surface of first interlayer resin insulation layer 40, an anchoring effect is achieved with surface-treatment coating 80 formed on via conductor 50, and adhesiveness is improved between via conductor 50 and surface-treatment coating 80.

Here, when the base (the first-surface side of via conductor 50) for forming surface-treatment coating 80 is a sputtered film, such a film will show barrier functions because of its fine crystallization and suppress copper ions forming the via conductor from being diffused into surface-treatment coating 80. Thus, the adhesive strength of surface-treatment coating 80 is ensured. However, even if surface-treatment coating 80 formed by electrolytic plating is made from the same metal as the sputtered film (Cu-sputtered film (44c)), their crystallization structures are different. In addition, since a sputtered film (Cu-sputtered film (44c)) has a flat surface compared with a plated film, surface-treatment coating 80 may possibly be removed from via conductor 50, for example, at the time of wire bonding or when heat is generated in the module. Therefore, in the present embodiment, the first-surface side of via conductor 50 is made to protrude from the second surface of first interlayer resin insulation layer 40. Therefore, even if the base (the first-surface side of via conductor 50) for forming surface-treatment coating 80 is a sputtered film, adhesiveness is ensured between via conductor 50 and surface-treatment coating 80.

In the following, a method is described for manufacturing a printed wiring board according to the first embodiment.

Figure 1B:
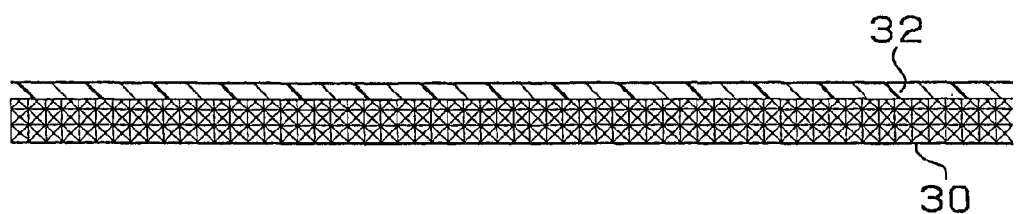
Figure 1C:
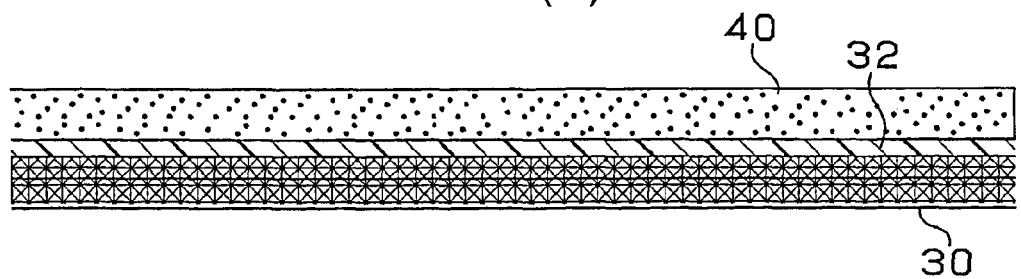

First, on support substrate 30 shown in FIG. 1A, 3 μm-thick thermoplastic resin (HT250, made by Nissan Chemical Industries, Ltd.) 32 is laminated (FIG. 1B). Then, 4 μm-thick interlayer resin insulation layer (brand name: WPR, made by JSR Corp.) 40 is laminated on thermoplastic resin 32 (FIG. 1C).

Figure 2A:
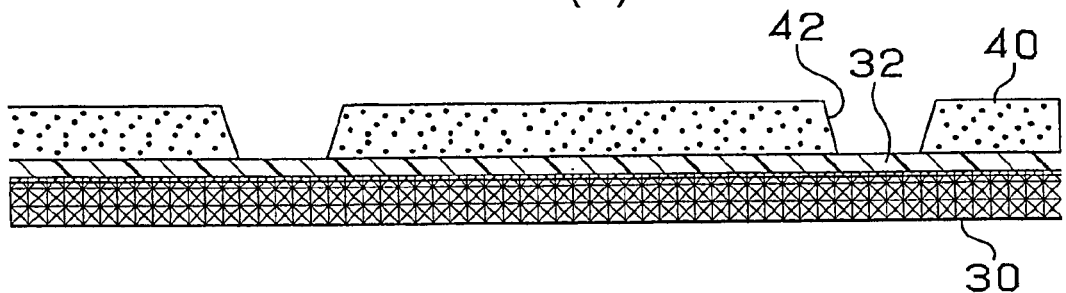
FIGS. 2(A)-2(C) are views of the steps for manufacturing a printed wiring board according to the first embodiment.
Figure 2B:
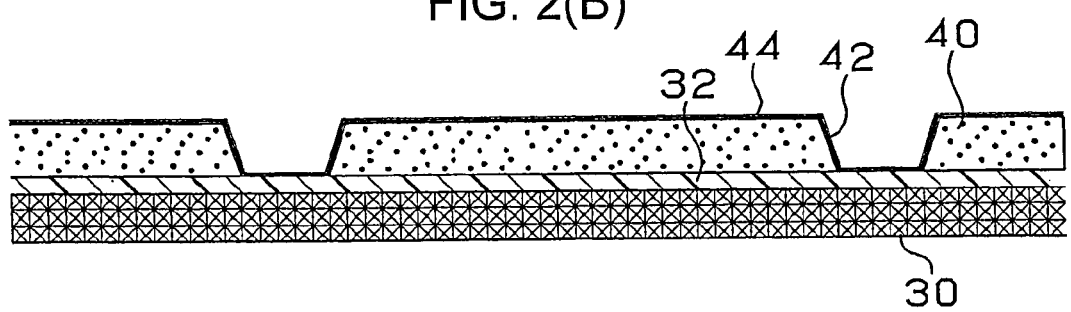

Using a photolithographic technique, via opening 42 with an approximate diameter of 200 μm is formed at a predetermined spot (FIG. 2A). On the surface of interlayer resin insulation layer 40, including the interior of via opening 42, three-layer shield layer 44 is formed by sputtering (FIG. 2B). The structure of such a shield layer is described in further detail by referring to a magnified view of opening 42 in FIG. 8A. Shield layer 44 is made of TiN-sputtered film (44a), Ti-sputtered film (44b) and Cu-sputtered film (44c). Since TiN-sputtered film (44a), Ti-sputtered film (44b) and Cu-sputtered film (44c) are formed by sputtering, they are each flat and thin, and are highly adhesive to each other.

Figure 2C:
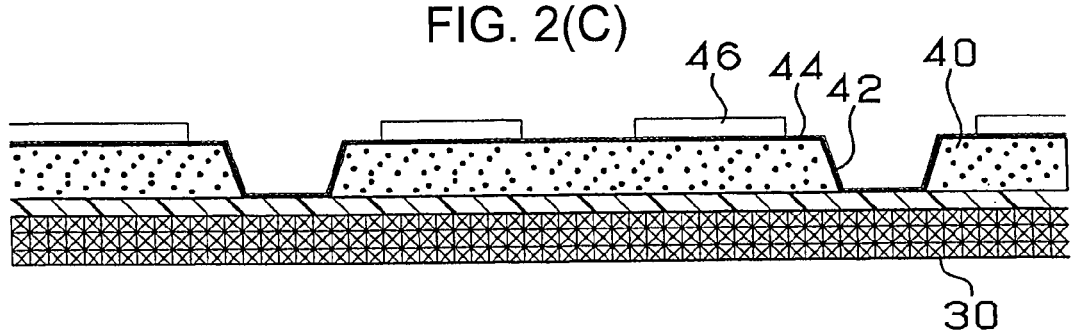
Figure 3A:
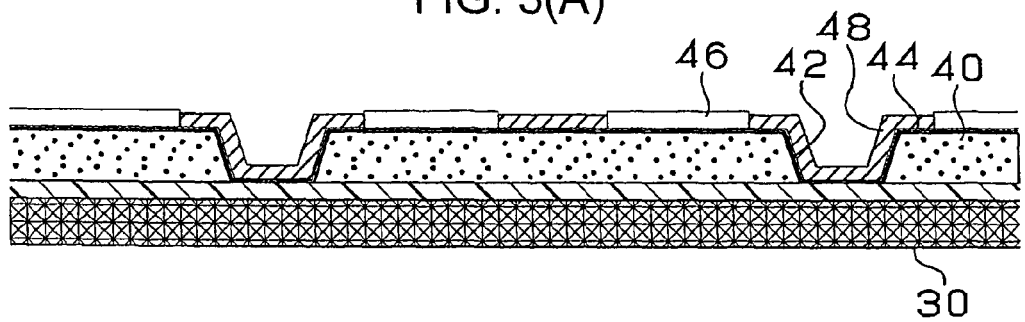
FIGS. 3(A)-3(D) are views of the steps for manufacturing a printed wiring board according to the first embodiment.
Figure 3B:
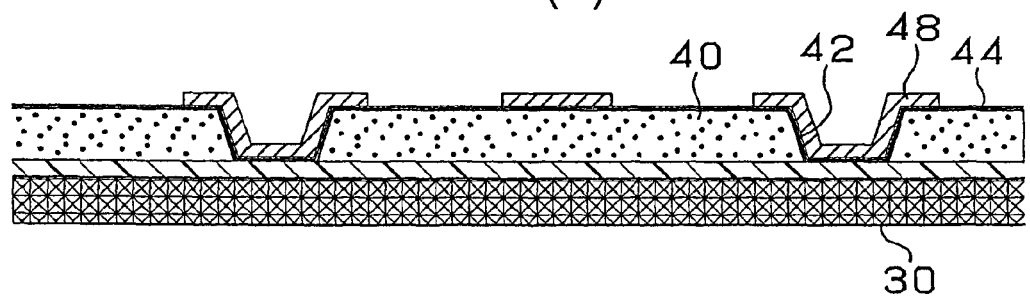
Figure 3C:
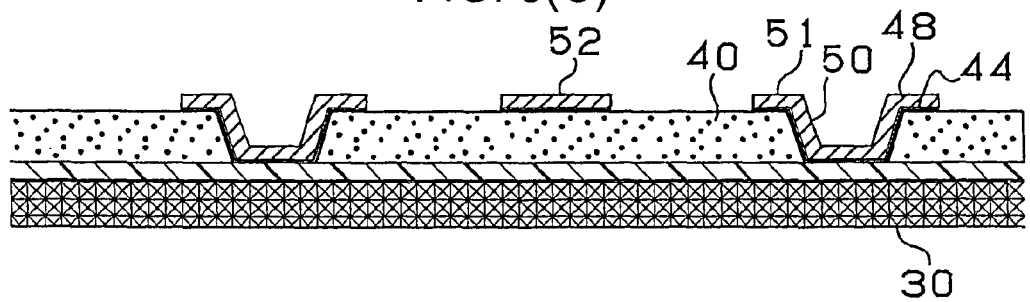

By applying a commercially available resist on interlayer resin insulation layer 40 coated with shield layer 44, then by conducting exposure and development, plating resist 46 with a predetermined pattern is formed (FIG. 2C). Then, by performing electrolytic plating, electrolytic copper-plated film 48 is formed on areas where the plating resist is not formed (FIG. 3A). Here, since electrolytic copper-plated film 48 is formed on Cu-sputtered film (44c) using copper as well, adhesiveness is high between shield layer 44 and electrolytic copper-plated film 48. By removing the plating resist (FIG. 3B), and by removing shield layer 44 under the plating resist using quick etching, via conductor 50 is formed in opening 42, and conductive circuit 52 and via land 51 are formed on interlayer resin insulation layer 40 (FIG. 3C). When forming two or more wiring layers, via conductor 50 is preferred to be a filled via. By forming via conductor 50 as a filled via, the surface of via conductor 50 becomes substantially flat. In cases of a printed wiring board having a multilayer wiring structure, it is possible to arrange a via conductor directly on via conductor 50. Thus, highly integrated wiring may be achieved.

Figure 3D:
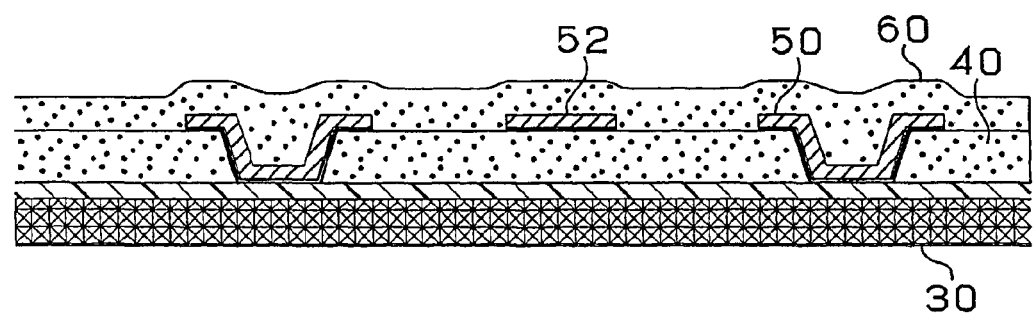
Figure 4A:
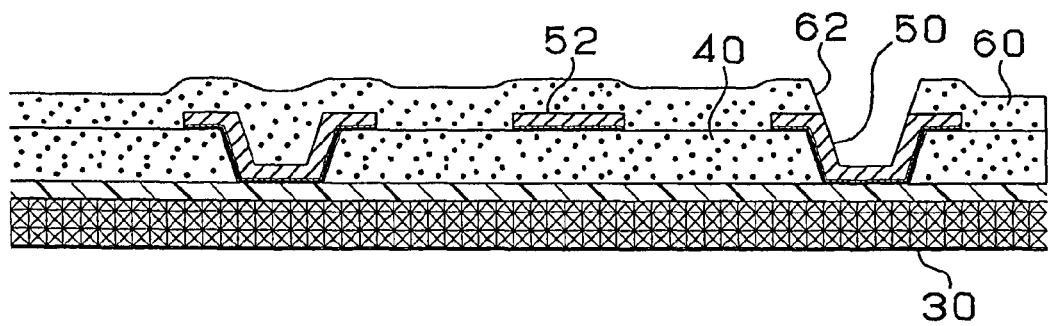
FIGS. 4(A)-4(C) are views of the steps for manufacturing a printed wiring board according to the first embodiment.
Figure 4B:
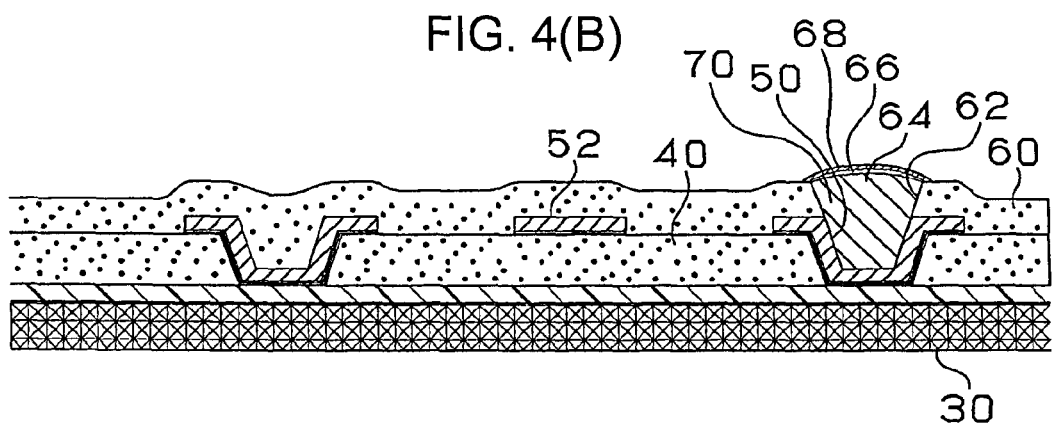

On first interlayer resin insulation layer 40 with conductive circuit 52, 4 μm-thick interlayer resin insulation layer (brand name: WPR, made by JSR Corp.) 60 is laminated (FIG. 3D). Using a photolithographic technique, opening 62 with a diameter of 200 μm is formed on a predetermined via conductor (FIG. 4A). Then, on via conductor 50 exposed through opening 62, Ni-plated layer 64, Pd-plated layer 66 and Au-plated layer 68 are formed in that order by electroless plating (FIG. 4B).

Figure 4C:
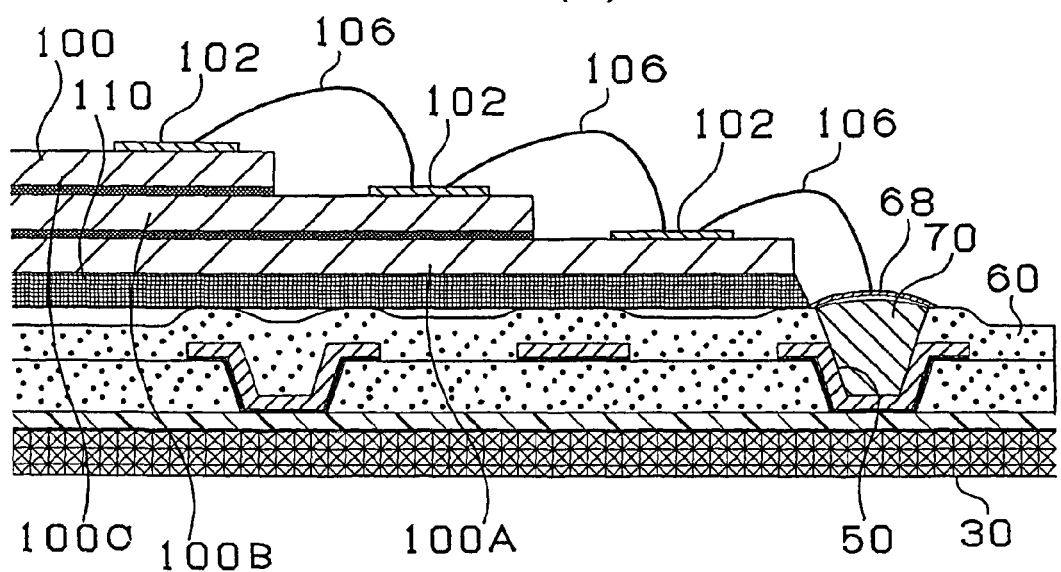

On interlayer resin insulation layer 60, memory laminate 100 made by laminating memories (100A, 100B, 100C) is mounted by means of adhesive layer 110, and pad 102 of memory laminate 100 and surface-treatment coating 70 (via conductor 50) are connected using wire 106 (FIG. 4C).

Figure 5A:
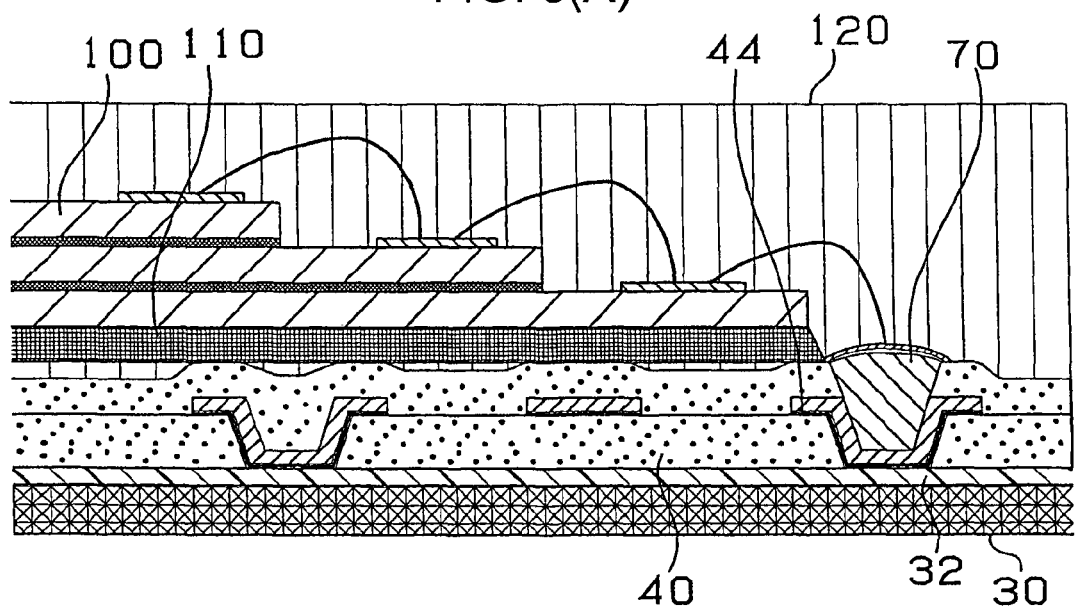
FIGS. 5(A)-5(B) are views of the steps for manufacturing a printed wiring board according to the first embodiment.
Figure 5B:
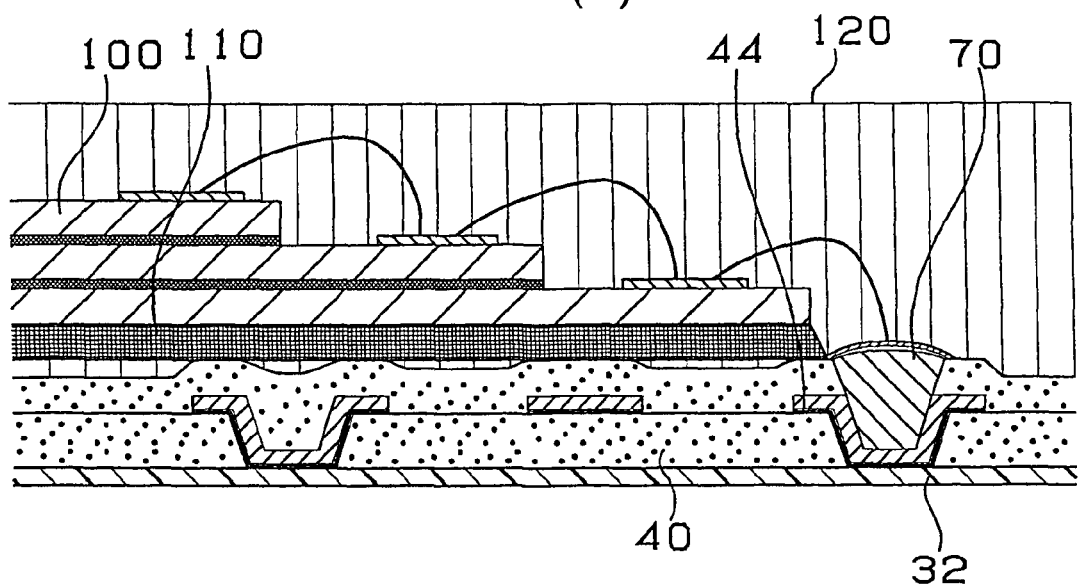
Figure 8A:
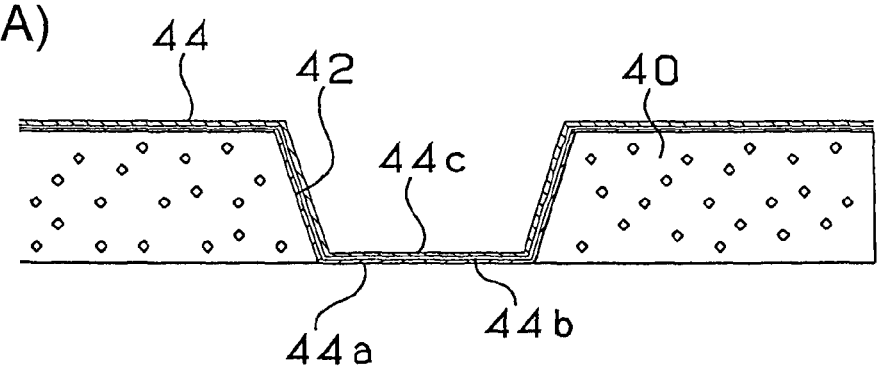
FIGS. 8(A)-8(C) are cross-sectional views showing a printed wiring board of the first embodiment.
Figure 8B:
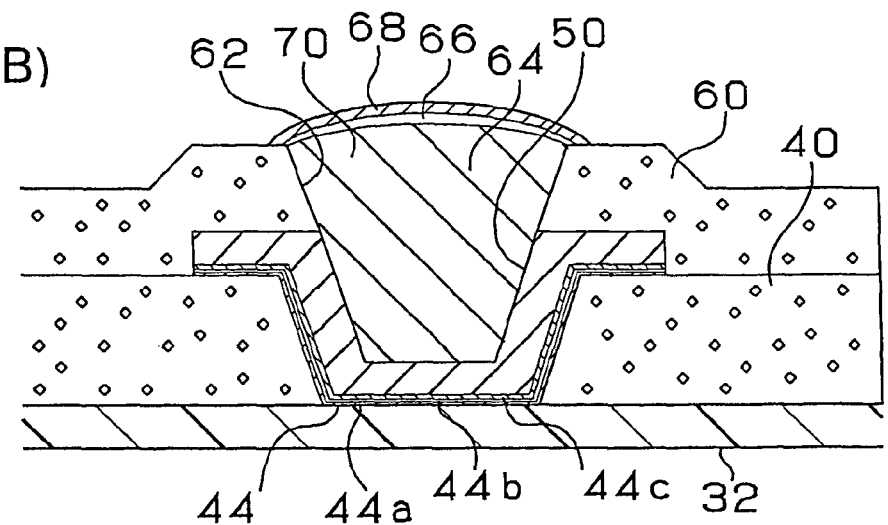
Figure 8C:
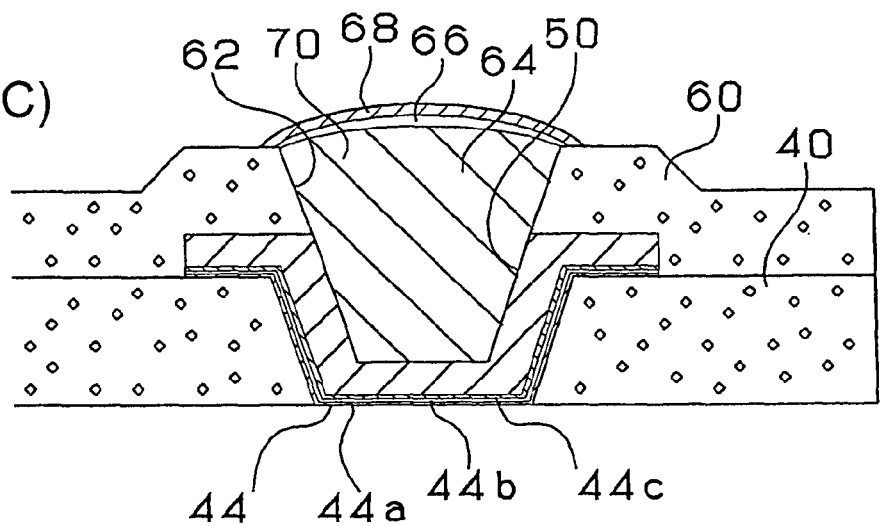

Interlayer resin insulation layer 60 and memory laminate 100 are encapsulated by molding resin 120 (FIG. 5A). After that, heat is added and support substrate 30 is removed by sliding it using thermoplastic resin 32 (FIG. 5B). FIG. 8B shows a magnified view of via conductor 50 after support substrate 30 is removed. Thermoplastic resin 32 is removed by ashing (FIG. 6A, and FIG. 8C which is a magnified view of FIG. 6A). Etching is conducted using an etchant containing KOH to remove Ti-sputtered film (44b) and TiN-sputtered film (44a) exposed through opening 42 in interlayer resin insulation layer 40. Here, Ti is easy to dissolve by KOH, but Cu is difficult to dissolve. FIG. 9A shows a magnified view of via conductor 50 after Ti-sputtered film (44b) and TiN-sputtered film (44a) exposed through opening 42 are removed.

Figure 6A:
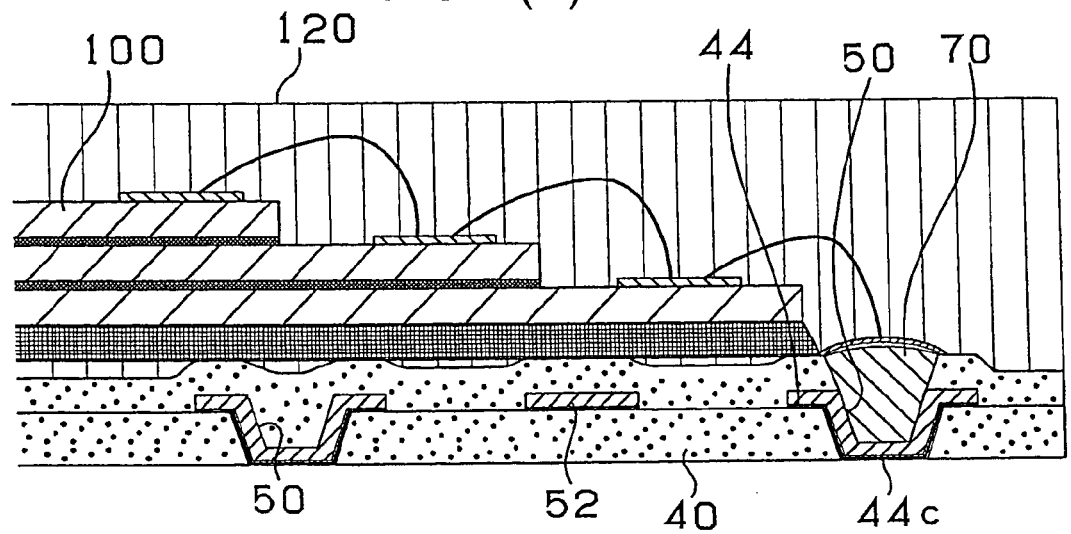
FIGS. 6(A)-6(B) are views of the steps for manufacturing a printed wiring board according to the first embodiment.
Figure 6B:
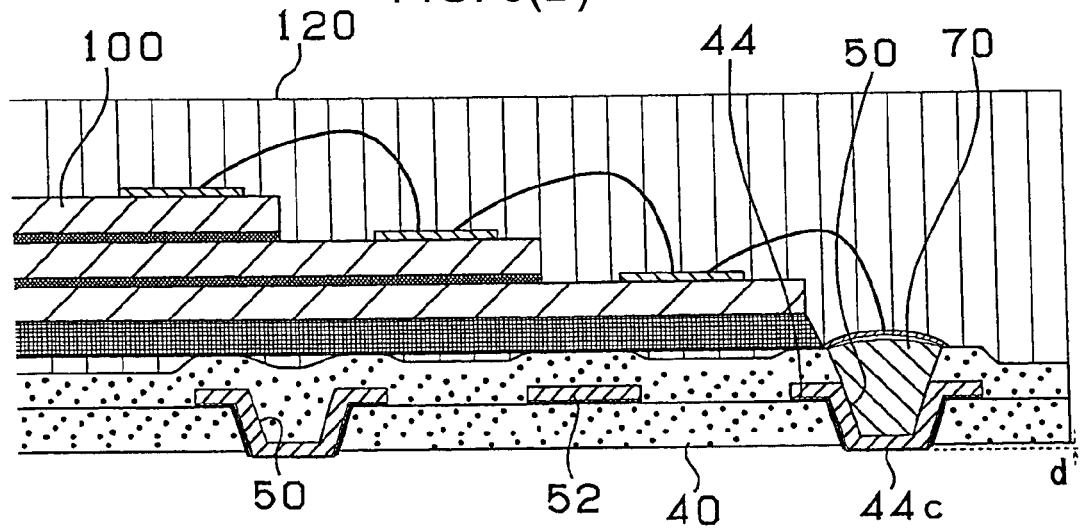

Then, the surface of first interlayer resin insulation layer 40 is polished by sandblasting to reduce the thickness by (d) (50 μm) (FIG. 6B, and FIG. 9B which is a magnified view of FIG. 6B). As described above with reference to FIG. 10B, the surface of Cu-sputtered film (44c) protrudes by distance (d) (50 μm) from the second surface of first interlayer resin insulation layer 40.

Then, after forming Ni film 82 by electroless plating on Cu-sputtered film (44c) on the bottom of via conductor 50, Pb film 84 and Au film 86 are formed in that order by electroless plating, and surface-treatment coating 80 is formed (FIG. 7). FIG. 9C shows a magnified view of surface-treatment coating 80 in FIG. 7.

A semiconductor apparatus manufactured as above is mounted on a motherboard by means of wires or solder bumps. Here, a multiple number of such semiconductor apparatuses may be laminated and then mounted on a motherboard. In doing so, for example, when mounting 16-tiered memories on a motherboard, it becomes feasible to use only good semiconductor apparatuses obtained by mounting 4-tiered memories on a printed wiring board as above, and productivity will increase.

Second Embodiment

A printed wiring board according to the second embodiment of the present invention and a method for manufacturing such a printed wiring board are described with reference to FIGS. 11-14.

Figure 12:
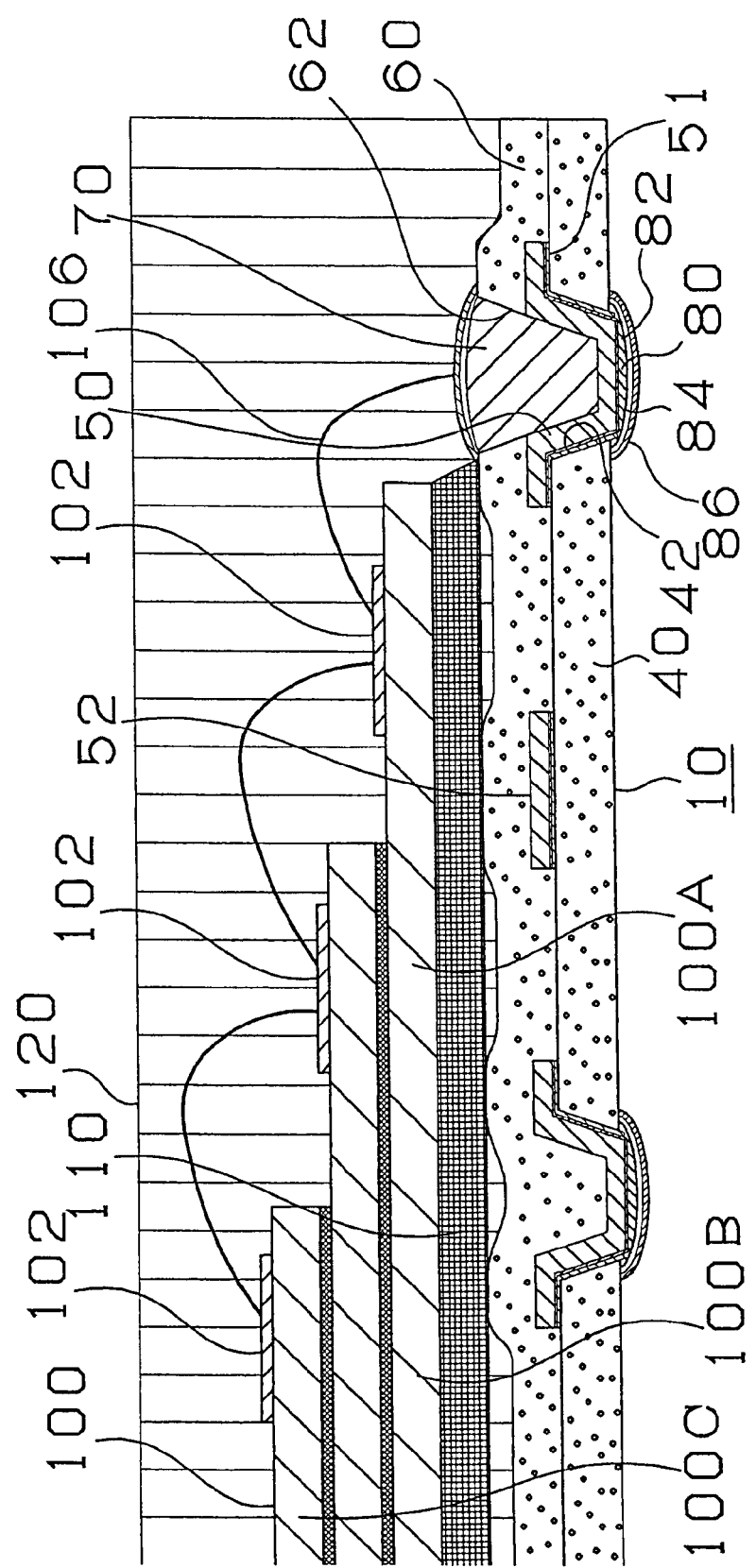
FIG. 12 is a cross-sectional view showing a printed wiring board of the second embodiment.
Figure 14A:
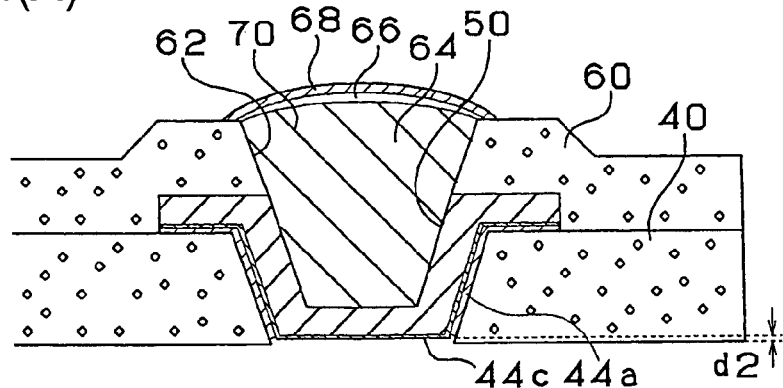
FIGS. 14(A)-14(C) are views of the manufacturing steps shown by magnifying a via conductor and a bump in a printed wiring board of the second embodiment.

FIG. 12 is a cross-sectional view showing part of printed wiring board 10. Printed wiring board 10 of the second embodiment is structured the same as in the first embodiment described above by referring to FIG. 7. However, in the first embodiment, three layers, Cu-sputtered film (44c), Ti-sputtered film (44b) and TiN-sputtered film (44a), were formed on the side wall of opening 42 in interlayer resin insulation layer 40. By contrast, in the second embodiment, as shown in FIG. 14C which is a magnified view of via conductor 50 in FIG. 12, a two-layer structure is employed where two layers made of TiN-sputtered film (44a) (first conductive layer) and Cu-sputtered film (44c) (second conductive layer) are formed on the side wall of opening 42.

In a printed wiring board of the second embodiment, since the bottom surface of via conductor 50 protrudes by 50 μm (d2) from the second surface of first interlayer resin insulation layer 40, an anchoring effect is achieved with surface-treatment coating 80 formed on via conductor 50, and adhesiveness is improved between via conductor 50 and surface-treatment coating 80.

In the following, a method for manufacturing a printed wiring board of the second embodiment is described.

Figure 11A:
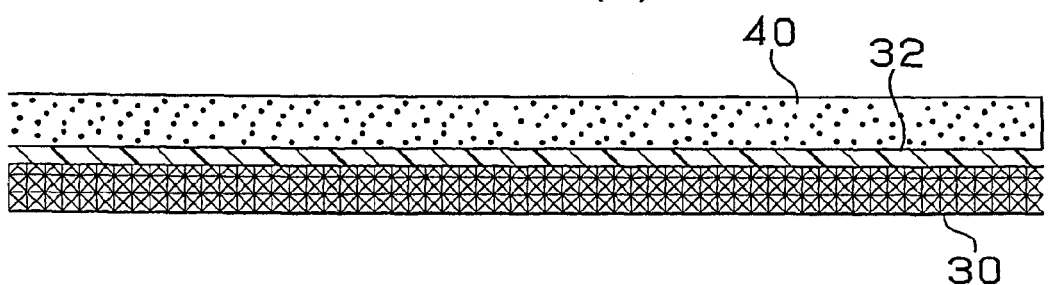
FIGS. 11(A)-11(C) are views of the steps for manufacturing a printed wiring board according to the second embodiment of the present invention.
Figure 11B:
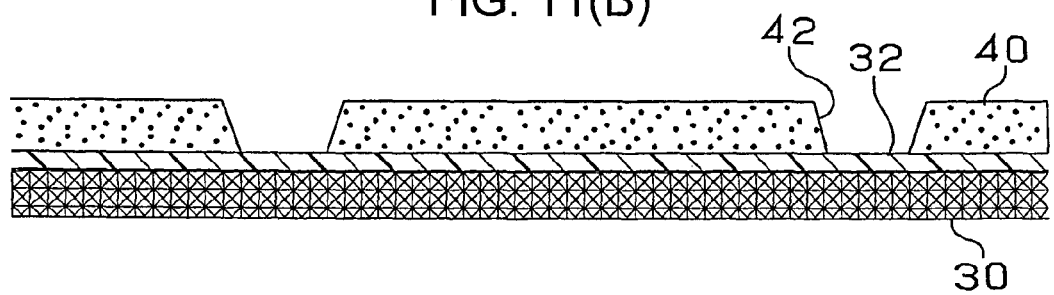
Figure 11C:
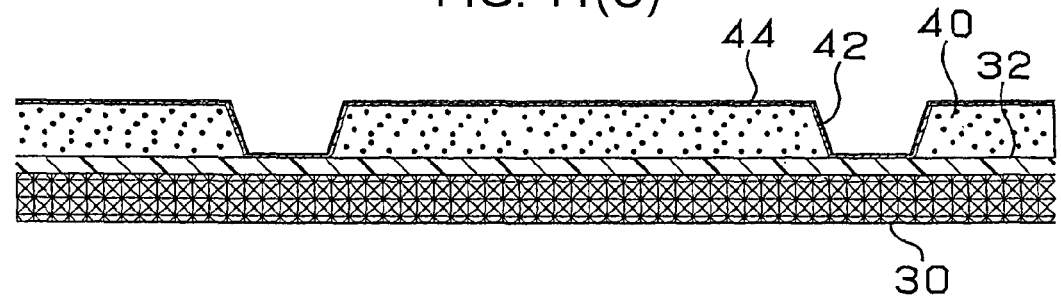

As described above by referring to FIGS. 1-2A, thermoplastic resin 32 is formed on silicon substrate 30 and interlayer resin insulation layer 40 is laminated on thermoplastic resin 32 (FIG. 11A). Via opening 42 with a diameter of 200 μm is formed at a predetermined spot (FIG. 11B). Two-layer shield layer 44 is formed by sputtering on the surface of interlayer resin insulation layer 40, including the interior of via opening 42 (FIG. 11C). The structure of such a shield layer is described in further detail by referring to a magnified view of opening 42 shown in FIG. 13A. Shield layer 40 is made of TiN sputtered film (44a) and Cu-sputtered film (44c).

Figure 13A:
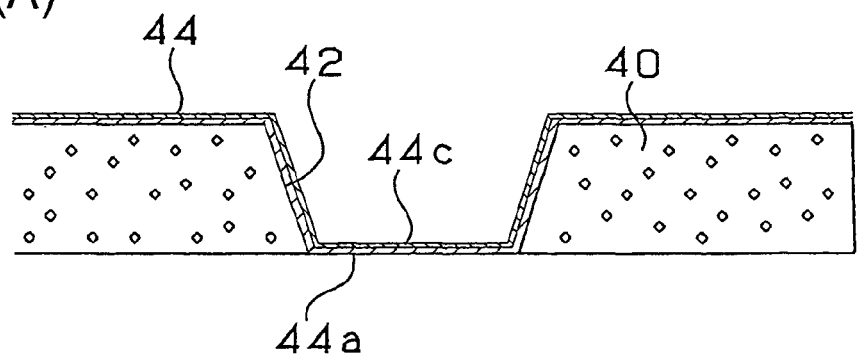
FIGS. 13(A)-13(C) are cross-sectional views showing a printed wiring board of the second embodiment.
Figure 13B:
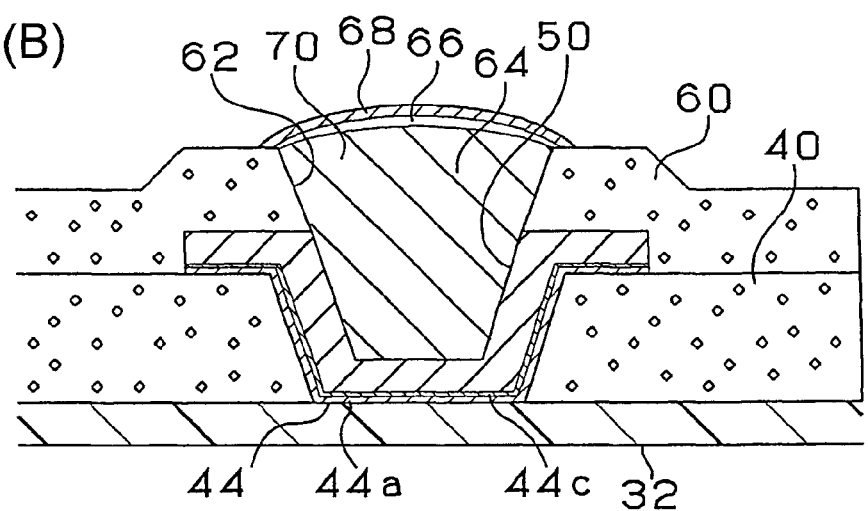
Figure 13C:
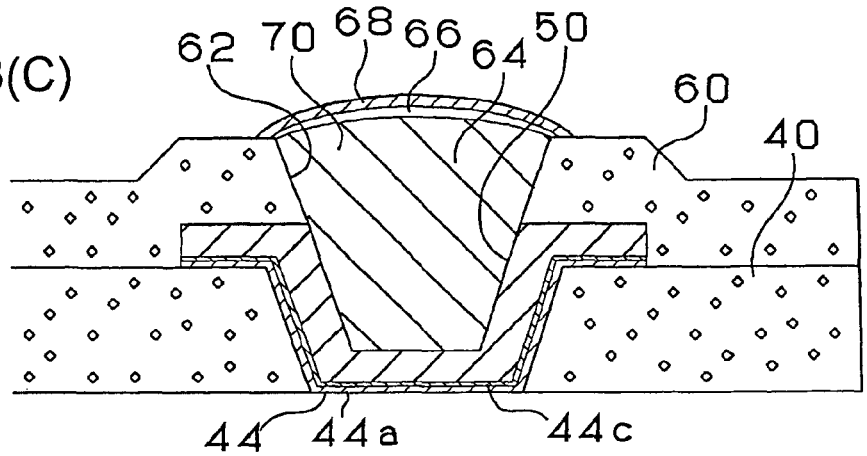

In the following, a printed wiring board is formed the same as in the first embodiment described above by referring to FIGS. 2C-5B, and interlayer resin insulation layer 60 and memory laminate 100 are encapsulated by molding resin 120. After that, heat is added and silicon substrate 30 is removed using thermoplastic resin 32 (FIG. 13B), and then thermoplastic resin 32 is removed by ashing (FIG. 13C). Etching is conducted using KOH to remove TiN-sputtered film (44a) exposed through opening 42 in interlayer resin insulation layer 40 (FIG. 14A).

Figure 14B:
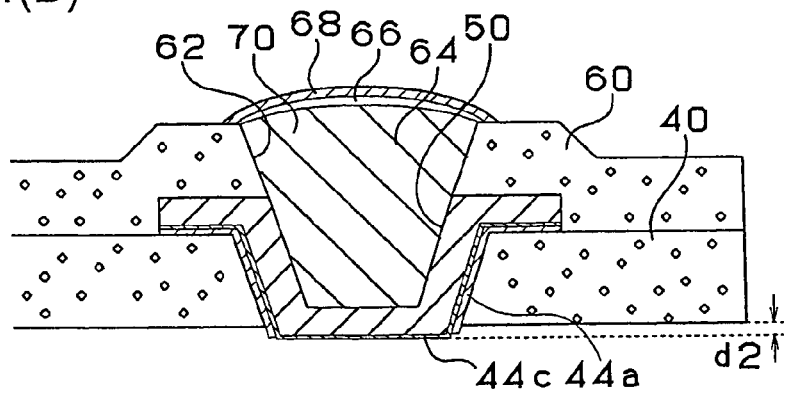
Figure 14C:
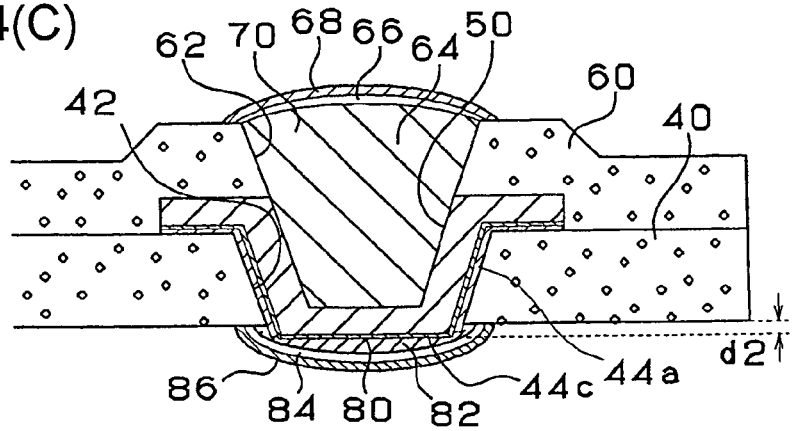

The surface of first interlayer resin insulation layer 40 is polished by sandblasting to reduce the thickness by (d2) (50 μm) (FIG. 14B). As described above with reference to FIG. 14C, the surface of Cu-sputtered film (44c) protrudes by distance (d) (50 μm) from the second surface of first interlayer resin insulation layer 40.

Then, Ni film 82 is formed by sputtering on Cu-sputtered film (44c) on the bottom portion of via conductor 50. After that, by coating Pb film 84 and Au film 86 through electroless plating, surface-treatment coating 80 is formed, which is made up of Ni film 82, Pb film 84 and Au film 86 (FIG. 12). FIG. 14C shows a magnified view of surface-treatment coating 80 in FIG. 12.

Third Embodiment

A method for manufacturing a printed wiring board according to the third embodiment is described with reference to FIGS. 15.

Figure 15A:
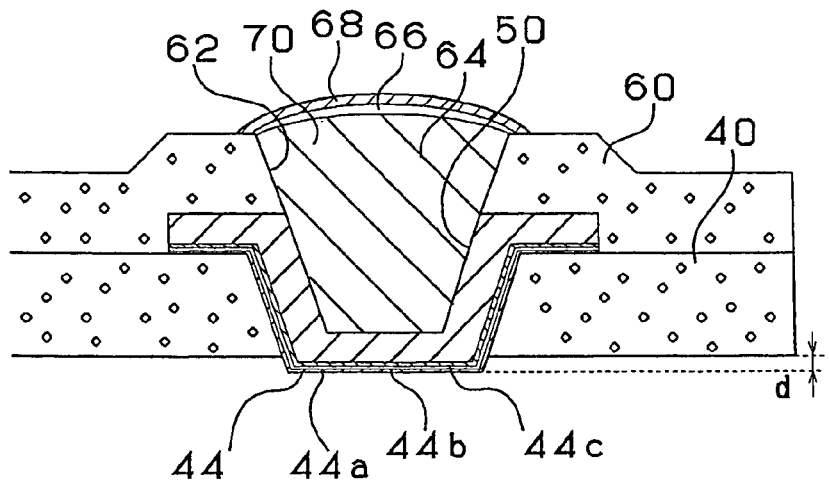
FIGS. 15(A)-15(C) are views of the manufacturing steps shown by magnifying a via conductor and a bump in a printed wiring board of the third embodiment.

In the first embodiment, after removing the thermoplastic resin, etching was conducted to remove Ti-sputtered film (44b) and TiN-sputtered film (44a) exposed through opening 42 in interlayer resin insulation layer 40. Then, the surface of first interlayer resin insulation layer 40 was polished by sandblasting. By contrast, in the third embodiment, after removing the thermoplastic resin as shown in FIG. 8C in the first embodiment, the surface of first interlayer resin insulation layer 40 is polished by sandblasting (FIG. 15A). After that, Ti-sputtered film (44b) and TiN-sputtered film (44a) exposed through opening 42 in interlayer resin insulation layer 40 are removed (FIG. 15B).

Figure 15B:
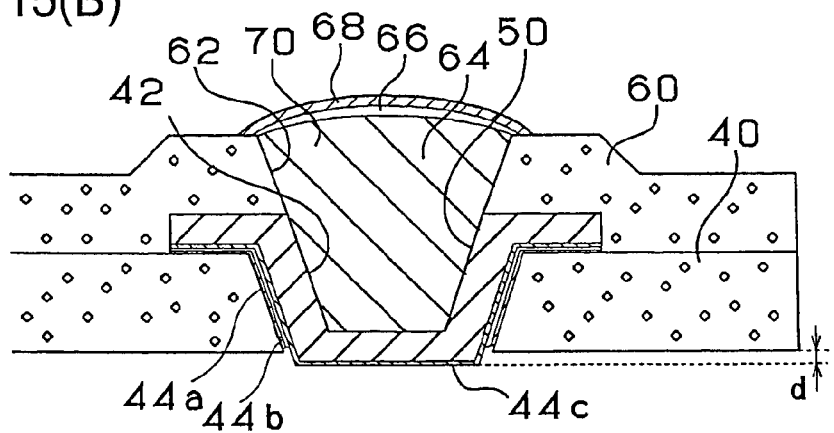
Figure 15C:
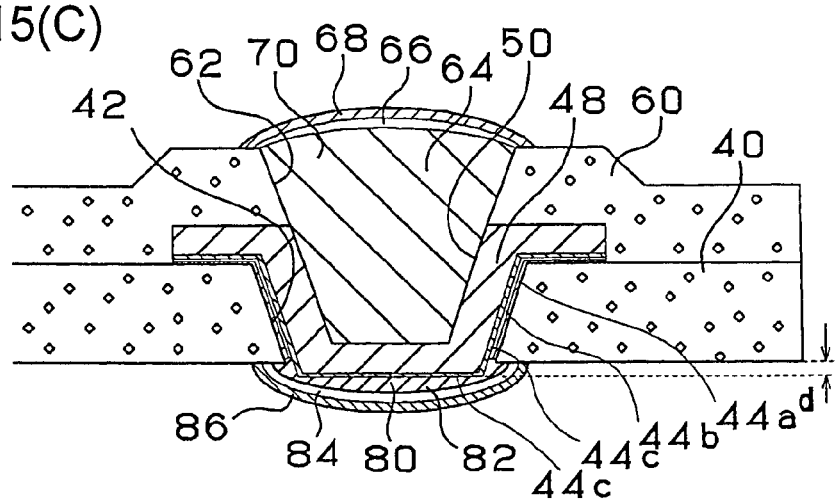

Then, after Ni film 82 is formed by electroless plating on Cu-sputtered film (44c) on the bottom portion of via conductor 50, Pb film 84 and Au film 86 are formed in that order by electroless plating, and surface-treatment coating 80 is formed (FIG. 15C).

In the third embodiment, as shown in FIG. 15B, Ti-sputtered film (44b) and TiN-sputtered film (44a) are removed up to the interior portion between opening 42 and Cu-sputtered film (44c), and Ni film 82 of surface-treatment coating 80 enters the space formed by such a removal as shown in FIG. 15C. Accordingly, adhesiveness may be enhanced between via conductor 50 and surface-treatment coating 80.

Fourth Embodiment

In the fourth embodiment, electroless copper-plated film is used as the first conductive layer. Namely, via conductor 50 is made up of electroless copper-plated film formed on the side wall of interlayer resin insulation layer 40, and of electrolytic plated film filled in opening 42. Here, when removing electroless copper-plated film on the bottom side (first-surface side) of a via conductor, for example, spraying an etchant is thought to be an option. However, the removal method is not limited specifically. In the present embodiment, the same functions and effects may be achieved as in the first embodiment.

Fifth Embodiment

In the fifth embodiment, a non-photosensitive interlayer resin insulation layer is used. In such a case, a via conductor opening is formed by a laser. During that time, it is preferred to form an opening up to the middle of a removal layer positioned under the interlayer resin insulation layer. In doing so, when a support substrate is removed after a wiring layer is formed by forming a via conductor inside the opening, the first surface of the via conductor will protrude from the second surface of the interlayer resin insulation layer, the same as in the first embodiment. In the fifth embodiment, the same effects may also be achieved as in the above first embodiment.

In a printed wiring board having a surface-treatment coating formed on the surface of the via conductor exposed through the penetrating hole, a via conductor is formed with a surface protruding from one surface of an interlayer resin insulation layer, an anchoring effect is achieved with a surface-treatment coating formed on the surface of the via conductor, and adhesiveness is improved between the via conductor and the surface-treatment coating. The via conductor may be made of a first conductive layer formed on a side wall of the penetrating hole and of a plated layer filling the penetrating hole.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an interlayer resin insulation layer having a penetrating hole;
   a conductive circuit formed on a first surface of the interlayer resin insulation layer;
   a filled via conductor formed in the penetrating hole of the interlayer resin insulation layer and connected to the conductive circuit;
   a first surface-treatment coating structure formed on a first surface of the filled via conductor and comprising an electroless plating structure; and
   a second surface-treatment coating structure formed on a second surface of the filled via conductor on an opposite side with respect to the first surface-treatment coating structure and comprising an electroless plating structure,
   wherein the filled via conductor comprises a first conductive layer formed on a side wall of the penetrating hole and a plated material filling the penetrating hole, and the first surface-treatment coating structure has a thickness which is different from a thickness of the second surface-treatment coating structure.

2. The printed wiring board according to claim 1, wherein the first surface-treatment coating structure includes a Ni layer, a Pd layer and a Au layer.

3. The printed wiring board according to claim 1, wherein the first surface-treatment coating structure includes a Ni layer having a thickness of 10 µm, a Pd layer having a thickness of 0.05 µm, and a Au layer having a thickness of 0.3 µm.

4. The printed wiring board according to claim 1, wherein the first surface-treatment coating structure includes a Ni layer, a Pd layer and a Au layer, and the second surface-treatment coating structure includes a Ni layer, a Pd layer and a Au layer.

5. The printed wiring board according to claim 1, wherein the first surface-treatment coating structure includes a Ni layer having a thickness of 10 µm, a Pd layer having a thickness of 0.05 µm, and a Au layer having a thickness of 0.3 µm, and the second surface-treatment coating structure includes a Ni layer having a thickness of 6 µm, a Pd layer having a thickness of 0.05 µm, and a Au layer having a thickness of 0.3 µm.

6. The printed wiring board according to claim 1, wherein the first surface-treatment coating structure includes a Ni layer, a Pd layer formed on the Ni layer, and a Au layer formed on the Pd layer.

7. The printed wiring board according to claim 1, wherein the first surface-treatment coating structure includes a Ni layer having a thickness of 10 µm, a Pd layer formed on the Ni layer and having a thickness of 0.05 µm, and a Au layer formed on the Pd layer and having a thickness of 0.3 µm.

8. The printed wiring board according to claim 1, wherein the first surface-treatment coating structure includes a Ni layer, a Pd layer formed on the Ni layer, and a Au layer formed on the Pd layer, and the second surface-treatment coating structure includes a Ni layer, a Pd layer formed on the Ni layer, and a Au layer formed on the Pd layer.

9. The printed wiring board according to claim 1, wherein the first surface-treatment coating structure includes a Ni layer having a thickness of 10 µm, a Pd layer formed on the Ni layer and having a thickness of 0.05 µm, and a Au layer formed on the Pd layer and having a thickness of 0.3 µm, and the second surface-treatment coating structure includes a Ni layer having a thickness of 6 µm, a Pd layer formed on the Ni layer and having a thickness of 0.05 µm, and a Au layer formed on the Pd layer and having a thickness of 0.3 µm.

10. The printed wiring board according to claim 1, wherein the filled via conductor has a flat surface, and the first surface-treatment coating structure is formed on the flat surface of the filled via conductor.

11. The printed wiring board according to claim 1, further comprising:
    a second interlayer resin insulation layer comprising a photosensitive resin layer and formed on the interlayer resin insulation layer,
    wherein the first surface-treatment coating structure is formed in an opening portion of the second interlayer resin insulation layer.

12. The printed wiring board according to claim 11, wherein the first surface-treatment coating structure includes a Ni layer, a Pd layer and a Au layer, and the first surface-treatment coating structure is formed such that the Ni layer has a thickness which is substantially equal to or greater than a thickness of the second interlayer resin insulation layer.

13. The printed wiring board according to claim 1, wherein the interlayer resin insulation layer comprises a non-photosensitive resin layer.

14. The printed wiring board according to claim 1, wherein the filled via conductor has a protruding portion protruding from the second surface of the interlayer resin insulation layer.

15. The printed wiring board according to claim 1, wherein the filled via conductor has a second conductive layer between the first conductive layer and the plated material.

16. A method for manufacturing a printed wiring board, comprising:

forming a penetrating hole in an interlayer resin insulation layer;
forming a conductive circuit on a first surface of the interlayer resin insulation layer;
forming a filled via conductor in the penetrating hole of the interlayer resin insulation layer such that the filled via conductor is connected to the conductive circuit;
forming a first surface-treatment coating structure comprising an electroless plating structure on a first surface of the filled via conductor; and
forming a second surface-treatment coating structure comprising an electroless plating structure on a second surface of the filled via conductor on an opposite side with respect to the first surface-treatment coating structure such that the first surface-treatment coating structure has a thickness which is different from a thickness of the second surface-treatment coating structure,
wherein the filled via conductor comprises a first conductive layer formed on a side wall of the penetrating hole and a plated material filling the penetrating hole.

17. The method for manufacturing a printed wiring board according to claim 16, wherein the forming of the first surface-treatment coating structure includes forming a Ni layer, forming a Pd layer and forming a Au layer.

18. The method for manufacturing a printed wiring board according to claim 16, wherein the forming of the first surface-treatment coating structure includes forming a Ni layer having a thickness of 10 μm, forming a Pd layer having a thickness of 0.05 μm, and forming a Au layer having a thickness of 0.3 μm.

19. The method for manufacturing a printed wiring board according to claim 16, wherein the forming of the first surface-treatment coating structure includes forming a Ni layer, forming a Pd layer and forming a Au layer, and the forming of the second surface-treatment coating structure includes forming a Ni layer, forming a Pd layer and forming a Au layer.

20. The method for manufacturing a printed wiring board according to claim 16, wherein the interlayer resin insulation layer comprises a non-photosensitive resin layer, and the forming of the penetrating hole in the interlayer resin insulation layer comprises irradiating laser upon a surface of the interlayer resin insulation layer such that the penetrating hole is formed through the interlayer resin insulation layer.

\* \* \* \* \*